(12) United States Patent
Xiang et al.

(10) Patent No.: US 10,270,469 B2
(45) Date of Patent: Apr. 23, 2019

(54) EFFICIENT DATA WRITE APPROACH FOR DISTRIBUTED MULTI-MIRROR ERASURE CODING SYSTEM

(71) Applicant: VMware, Inc., Palo Alto, CA (US)

(72) Inventors: Enning Xiang, San Jose, CA (US); Yiqi Xu, Palo Alto, CA (US)

(73) Assignee: VMware, Inc., Palo Alto, CA (US)

( * ) Notice: Subject to any disclaimer, the term of this patent is extended or adjusted under 35 U.S.C. 154(b) by 30 days.

(21) Appl. No.: 15/604,459

(22) Filed: May 24, 2017

(65) Prior Publication Data
US 2018/0343019 A1    Nov. 29, 2018

(51) Int. Cl.
  *G11C 29/00*    (2006.01)
  *H03M 13/15*    (2006.01)
  *G06F 11/10*    (2006.01)

(52) U.S. Cl.
  CPC ....... *H03M 13/154* (2013.01); *G06F 11/1076* (2013.01); *H03M 13/1515* (2013.01)

(58) Field of Classification Search
  CPC ............ H03M 13/154; H03M 13/1515; G06F 11/1076
  See application file for complete search history.

(56) References Cited

U.S. PATENT DOCUMENTS

2013/0179490 A1*    7/2013    Naga ................ G06F 17/30165
                                                                709/203

\* cited by examiner

*Primary Examiner* — Samir W Rizk
(74) *Attorney, Agent, or Firm* — Patterson + Sheridan, LLP (57) ABSTRACT

Certain embodiments described herein are generally directed to generating an updated version of an existing code block in response to a data update to an existing data block of a plurality of data blocks in a distributed multi-mirror erasure coding system. For example, in some embodiments, a first operation cost to generate the updated version of the existing code block by a first method based on the plurality of data blocks and the data update is determined. In certain embodiments, a second operation cost to generate the updated version of the existing code block by a second method based on the existing code block, the existing data block, and the data update is determined. In some embodiments, if the first operation cost is less than or equal to the second operation cost, the first method is used. Otherwise, the second method is used.

21 Claims, 5 Drawing Sheets

EFFICIENT DATA WRITE APPROACH FOR DISTRIBUTED MULTI-MIRROR ERASURE CODING SYSTEM

BACKGROUND

Distributed systems allow multiple clients in a network to access a pool of shared resources. For example, a distributed storage system allows a cluster of host computers to aggregate local disks (e.g., Solid State Drive (SSD), Peripheral Component Interconnect (PCI) based flash storage, Serial Advanced Technology Attachment (SATA), or Serial Attached Small Computer System Interface (SAS) magnetic disks) located in or attached to each host computer to create a single and shared pool of storage. This pool of storage (sometimes referred to herein as an "object store", "datastore" or "store") is accessible by all host computers in the cluster and may be presented as a single namespace of storage entities (such as a hierarchical file system namespace in the case of files, a flat namespace of unique identifiers in the case of objects, etc.). Storage clients such as virtual machines spawned on the host computers may use the aggregate object store, for example, to store virtual disks that are accessed by the virtual machines during their operation. Because the shared local disks that make up the object store may have different performance characteristics (e.g., capacity, input/output per second (IOPS) capabilities, etc.), usage of such shared local disks to store virtual disks or portions thereof may be distributed among the virtual machines based on the needs of each given virtual machine.

Providers of distributed storage systems must balance the heavy demands of availability, performance, reliability, and cost. Distributed replication and erasure coding are used to provide for the recovery of data in the event of storage device failure or other system failures. Erasure coding is a method of data protection in which data is broken into fragments or portions, expanded and encoded with redundant data pieces and stored across a set of different locations, e.g., storage devices in different geographic locations. Erasure coding creates a mathematical function (e.g., polynomial interpolation or oversampling) to describe a set of numbers representing a portion of data so they can be checked for accuracy and recovered if one of the numbers is lost. Erasure coding can be represented in simple form by the following equation: K=N+M. The variable "N" is the original number of portions of data. The variable "M" stands for extra or redundant portions of data that are added to provide protection from failures. The variable "K" is the total number of portions of data created after the erasure coding process. For example, in a 10 of 16 configuration, 6 extra portions of data (M) are added to the 10 base portions (N). The 16 data portions (K) are distributed across 16 storage devices. The 6 extra portions of data created after the erasure coding process may be referred to as code blocks, while the 10 base portions of data may be referred to as data blocks. In the event of data loss or a lost connection to one or more storage devices, the original data can be reconstructed using any 10 of the 16 blocks.

When a change is made to one of the data blocks (e.g., one of the N base portions in the example above), one or more of the code blocks (e.g., the M extra portions in the example above) may need to be recalculated to reflect the change. This ensures that the latest version of the data can still be reconstructed using any N of the K blocks. Recalculating a code block using erasure coding requires a certain number of I/O operations, as it involves reading data from existing blocks and applying a mathematical function to the data. In some cases, such as when a storage location containing a data block is unavailable, it may be necessary to reconstruct the data block using any N of the blocks which are available in order to recalculate the code block. Because of this, the number of I/O operations required to recalculate the code block may increase, and the overall performance of the system may be negatively impacted. As such, there exists a need for efficient methods of handling data updates within an erasure coding system.

SUMMARY

Herein described are one or more embodiments of a method for generating an updated version of an existing code block in response to a data update to an existing data block of a plurality of data blocks in a distributed multi-mirror erasure coding system. The method generally includes determining a first operation cost comprising a number of read operations required to generate the updated version of the existing code block based on the plurality of data blocks and the data update. The method further includes determining a second operation cost comprising a number of read operations required to generate the updated version of the existing code block based on the existing code block, the existing data block, and the data update. Upon determining that the first operation cost is less than or equal to the second operation cost, the method further includes generating the updated version of the existing code block based on the plurality of data blocks and the data update. Upon determining that the second operation cost is less than the first operation cost, the method further includes generating the updated version of the existing code block based on the one or more code blocks, the existing data block, and the data update.

Also described herein are embodiments of a non-transitory computer readable medium comprising instructions to be executed in a computer system, wherein the instructions when executed in the computer system perform a method described above for generating an updated version of an existing code block in response to a data update to an existing data block of a plurality of data blocks in a distributed multi-mirror erasure coding system.

Also described herein are embodiments of a computer system, wherein software for the computer system is programmed to execute the method described above for generating an updated version of an existing code block in response to a data update to an existing data block of a plurality of data blocks in a distributed multi-mirror erasure coding system.

DETAILED DESCRIPTION

Embodiments of the present disclosure relate to performance efficient methods of generating an updated code block in response to an updated data block in a distributed erasure coding system. Solutions may be implemented within a "virtual storage area network" (VSAN), as described below with respect to FIGS. 1-3, which implements a fault tolerant configuration with mirrored copies of the virtual disk, as described below with respect to FIG. 2, using erasure coding, as described below with respect to FIG. 4. As will be discussed in more detail below with respect to FIG. 5, solutions may involve determining the performance cost of different methods of generating an updated code block in response to an updated data block, and utilizing the method with the lowest performance cost.

Figure 1:
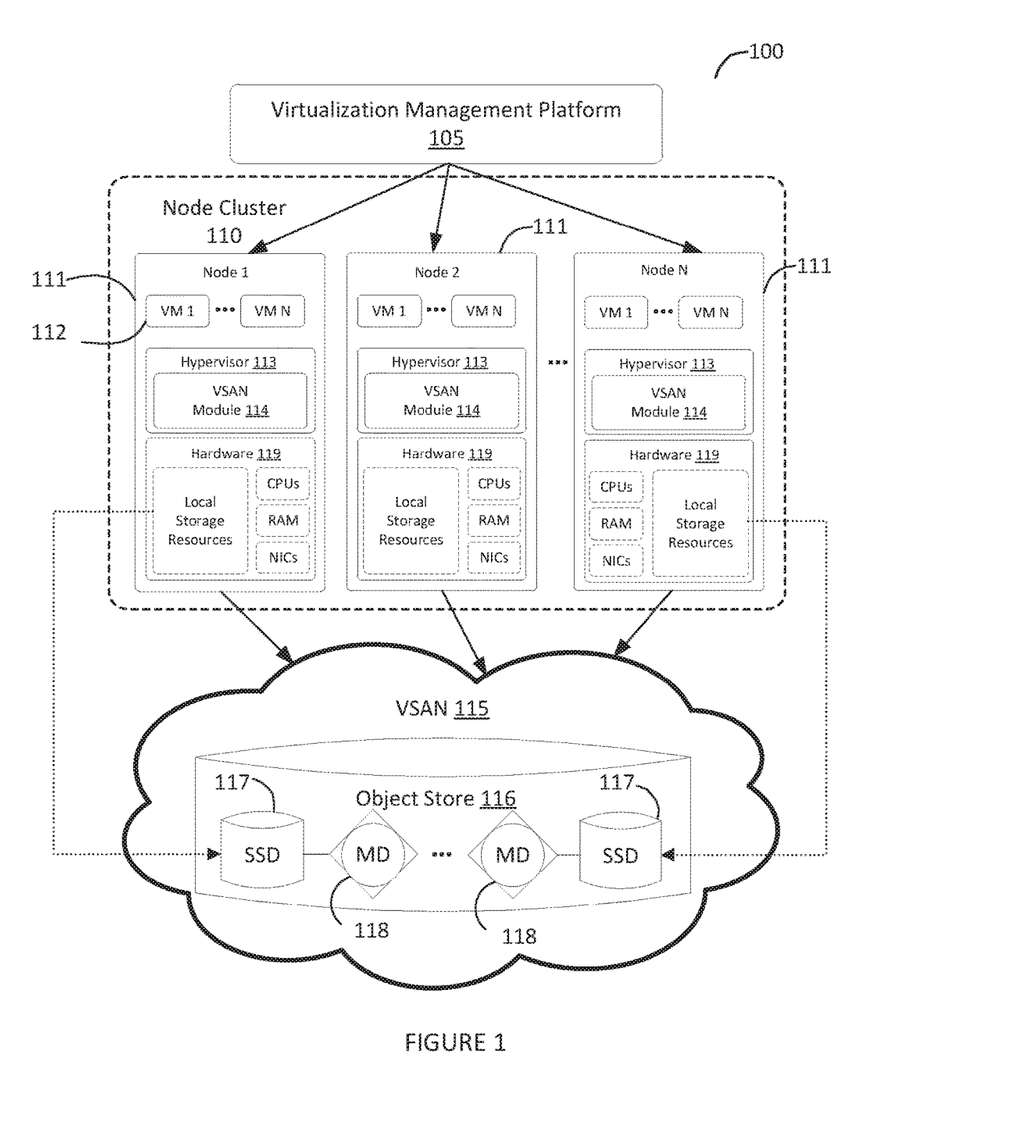
FIG. 1 illustrates an example computing environment within which embodiments of the present disclosure are implemented.

FIG. 1 illustrates a computing environment 100, according to one embodiment. As shown, computing environment 100 is a software-based "virtual storage area network" (VSAN) environment that leverages the commodity local storage (e.g., local disks) housed in or directly attached (hereinafter, use of the term "housed" or "housed in" may be used to encompass both housed in or otherwise directly attached) to host servers (also referred to as "nodes") 111 of a cluster 110 of nodes to provide an object store 116 to virtual machines (VMs) 112 running on the nodes. The local commodity storage housed in or otherwise directly attached to the nodes 111 may include combinations of solid state drives (SSDs) 117 and/or magnetic or spinning disks 118. In certain embodiments, SSDs 117 serve as a read cache and/or write buffer in front of magnetic disks 118 to increase I/O performance. As further discussed below, each node 111 may include a storage management module (referred to herein as a "VSAN module") in order to automate storage management workflows (e.g., create objects in the object store, etc.) and provide access to objects in the object store (e.g., handle I/O operations to objects in the object store, etc.) based on predefined storage policies specified for objects in the object store. For example, because a VM may be initially configured by an administrator to have specific storage requirements for its "virtual disk" depending on its intended use (e.g., capacity, availability, IOPS, etc.), the administrator may define a storage profile or policy for each VM specifying such availability, capacity, IOPS and the like. As further described below, the VSAN module may then create a flexible data container called an "object" for the specified virtual disk which is assigned to certain physical storage resources of the object store based on the defined policy, and which maintains data and metadata about the virtual disk.

A virtualization management platform 105 is associated with cluster 110 of nodes 111. Virtualization management platform 105 is a software component which enables an administrator to manage the configuration and spawning of VMs on the various nodes 111, and may, for example, reside on a management server. As depicted in the embodiment of FIG. 1, each node 111 includes a virtualization layer or hypervisor 113, a VSAN module 114, and hardware 119 (which includes the SSDs 117 and magnetic disks 118 of a node 111). Through hypervisor 113, a node 111 is able to launch and run multiple VMs 112. Hypervisor 113, in part, manages hardware 119 to properly allocate computing resources (e.g., processing power, random access memory, etc.) for each VM 112. Furthermore, as described further below, each hypervisor 113, through its corresponding VSAN module 114, provides access to storage resources located in hardware 119 (e.g., SSDs 117 and magnetic disks 118) for use as storage for virtual disks (or portions thereof) and other related files that may be accessed by any VM 112 residing in any of nodes 111 in cluster 110. In some embodiments, access to storage resources is provided to VMs 112 by a VSAN module 114 via a physical network interface card (PNIC) located in hardware 119. In a particular embodiment, vSphere Hypervisor from VMware, Inc. (VMware) may be installed on nodes 111 as hypervisor 113 and vCenter Server from VMware may be used as virtualization management platform 105.

In one embodiment, VSAN module 114 is implemented as a "VSAN" device driver within hypervisor 113. In such an embodiment, VSAN module 114 provides access to a conceptual "VSAN" 115 through which an administrator can create a number of top-level "device" or namespace objects that are stored in aggregate object store 116. A device or namespace object comprises a flexible data container which represents a logical volume and contains data and metadata. For example, an object may be created for a virtual disk, and the object may store the contents of a virtual machine's hard disk drive. In one common scenario, during creation of a device object, the administrator may specify a particular file system for the device object (such device objects hereinafter are also referred to as "file system objects"). For example, in one embodiment, each hypervisor 113 in each node 111 may, during a boot process, discover a /vsan/ root node for a conceptual global namespace that is exposed by VSAN module 114. By, for example, accessing APIs exposed by VSAN module 114, hypervisor 113 can then determine all the top-level file system objects (or other types of top-level device objects) currently residing in VSAN 115. When a VM (or other client) attempts to access one of the file system objects, hypervisor 113 may dynamically "auto-mount" the file system object at that time. Auto-mounting involves automatically mounting a file system object in response to access operations by user programs, and conserves resources by deferring the mounting of such a file system until a process actually needs to access it. In certain embodiments, file system objects may further be periodically "auto-unmounted" when access to objects in the file system objects cease or are idle for a period of time. A file system object (e.g., /vsan/fs_name1, etc.) that is accessible through VSAN 115 may, for example, be implemented to emulate the semantics of a particular file system such as VMware's distributed or clustered file system, VMFS, which is designed to provide concurrency control among simultaneously accessing VMs. Because VSAN 115 supports multiple file system objects, it is able to provide storage resources through object store 116 without being confined by limitations of any particular clustered file system. For example, many clustered file systems (e.g., VMFS, etc.) can only scale to support a certain number of nodes 111. By providing multiple top-level file system object support, VSAN 115 overcomes the scalability limitations of such clustered file systems.

As described in further detail in the context of FIG. 2 below, a file system object, may, itself, provide access to a number of virtual disk descriptor files (e.g., .vmdk files in a vSphere environment, etc.) accessible by VMs 112 running in cluster 110. These virtual disk descriptor files contain references to virtual disk "objects" that contain the actual data for the virtual disk and are separately backed by object store 116. A virtual disk object may itself be a hierarchical or "composite" object that, as described further below, is further composed of "component" objects (again separately backed by object store 116) that reflect the storage requirements (e.g., capacity, availability, IOPs, etc.) of a corresponding storage profile or policy generated by the administrator when initially creating the virtual disk. As further discussed below, each VSAN module 114 (through a cluster level object manager or "CLOM" sub-module, in embodiments as further described below) communicates with other VSAN modules 114 of other nodes 111 to create and maintain an in-memory metadata database (e.g., maintained separately but in synchronized fashion in the memory of each node 111) that contains metadata describing the locations, configurations, policies and relationships among the various objects stored in object store 116. This in-memory metadata database is utilized by a VSAN module 114 on a node 111, for example, when an administrator first creates a virtual disk for a VM as well as when the VM is running and performing I/O operations (e.g., read or write) on the virtual disk. As further discussed below in the context of FIG. 3, VSAN module 114 (through a distributed object manager (DOM) sub-module, in one embodiment as further described below) traverses a hierarchy of objects using the metadata in the in-memory database in order to properly route an I/O operation request to the node (or nodes) that houses (house) the actual physical local storage that backs the portion of the virtual disk that is subject to the I/O operation.

Figure 2:
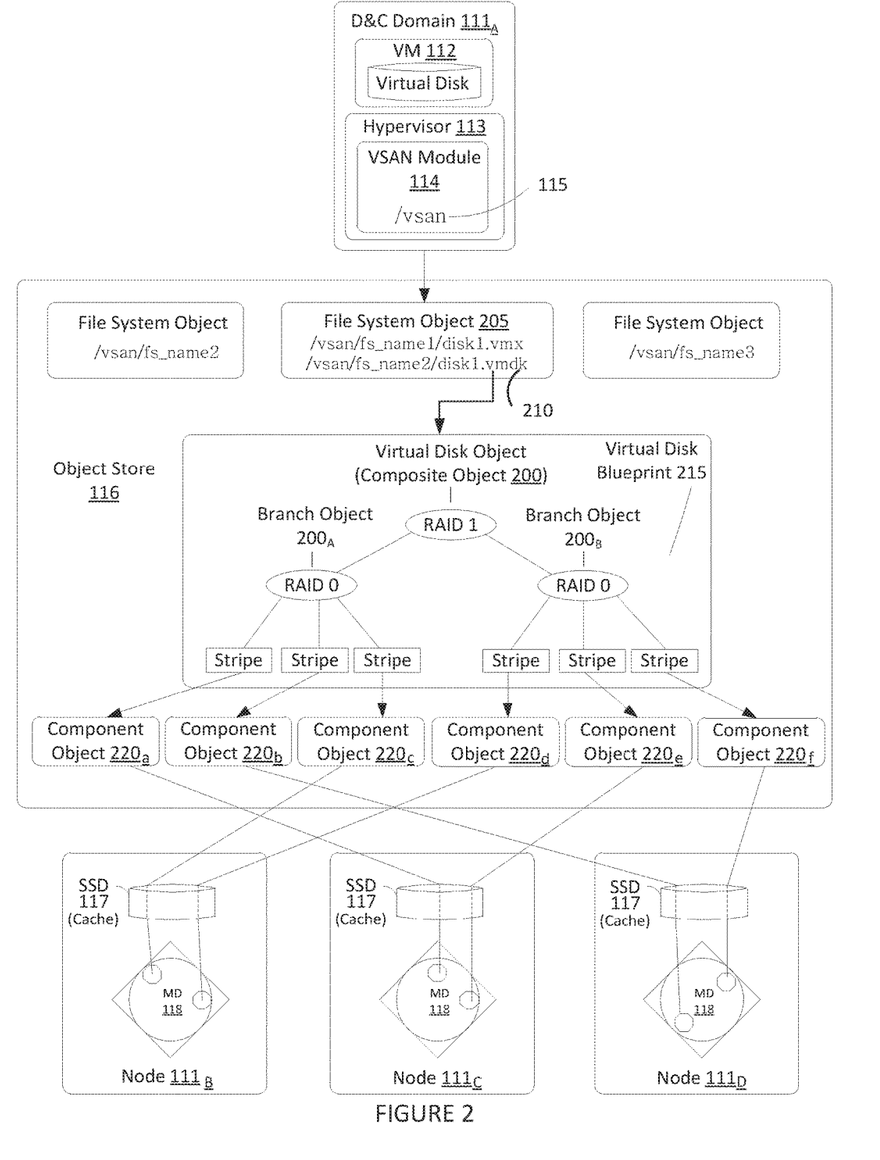
FIG. 2 illustrates an example hierarchical structure of objects organized within an object store that represent a virtual disk, according to one embodiment.

FIG. 2 illustrates an example hierarchical structure of objects organized within object store 116 that represent a virtual disk, according to one embodiment. As previously discussed above, a VM 112 running on one of nodes 111 may perform I/O operations on a virtual disk that is stored as a hierarchical or composite object 200 in object store 116. Hypervisor 113 provides VM 112 access to the virtual disk (e.g., through a PNIC) by interfacing with the abstraction of VSAN 115 through VSAN module 114 (e.g., by automounting the top-level file system object corresponding to the virtual disk object, as previously discussed, in one embodiment). For example, VSAN module 114, by querying its local copy of the in-memory metadata database, is able to identify a particular file system object 205 (e.g., a VMFS file system object in one embodiment, etc.) stored in VSAN 115 that stores a descriptor file 210 for the virtual disk (e.g., a .vmdk file, etc.). It should be recognized that the file system object 205 may store a variety of other files consistent with its purpose, such as virtual machine configuration files (e.g., .vmx files in a vSphere environment, etc.) and the like when supporting a virtualization environment. In certain embodiments, each file system object may be configured to support only those virtual disks corresponding to a particular VM (e.g., a "per-VM" file system object).

Descriptor file 210 includes a reference to composite object 200 that is separately stored in object store 116 and conceptually represents the virtual disk (and thus may also be sometimes referenced herein as a virtual disk object). Composite object 200 stores metadata describing a storage organization or configuration for the virtual disk (sometimes referred to herein as a virtual disk "blueprint") that suits the storage requirements or service level agreements (SLAs) in a corresponding storage profile or policy (e.g., capacity, availability, IOPs, etc.) generated by an administrator when creating the virtual disk.

Figure 4:
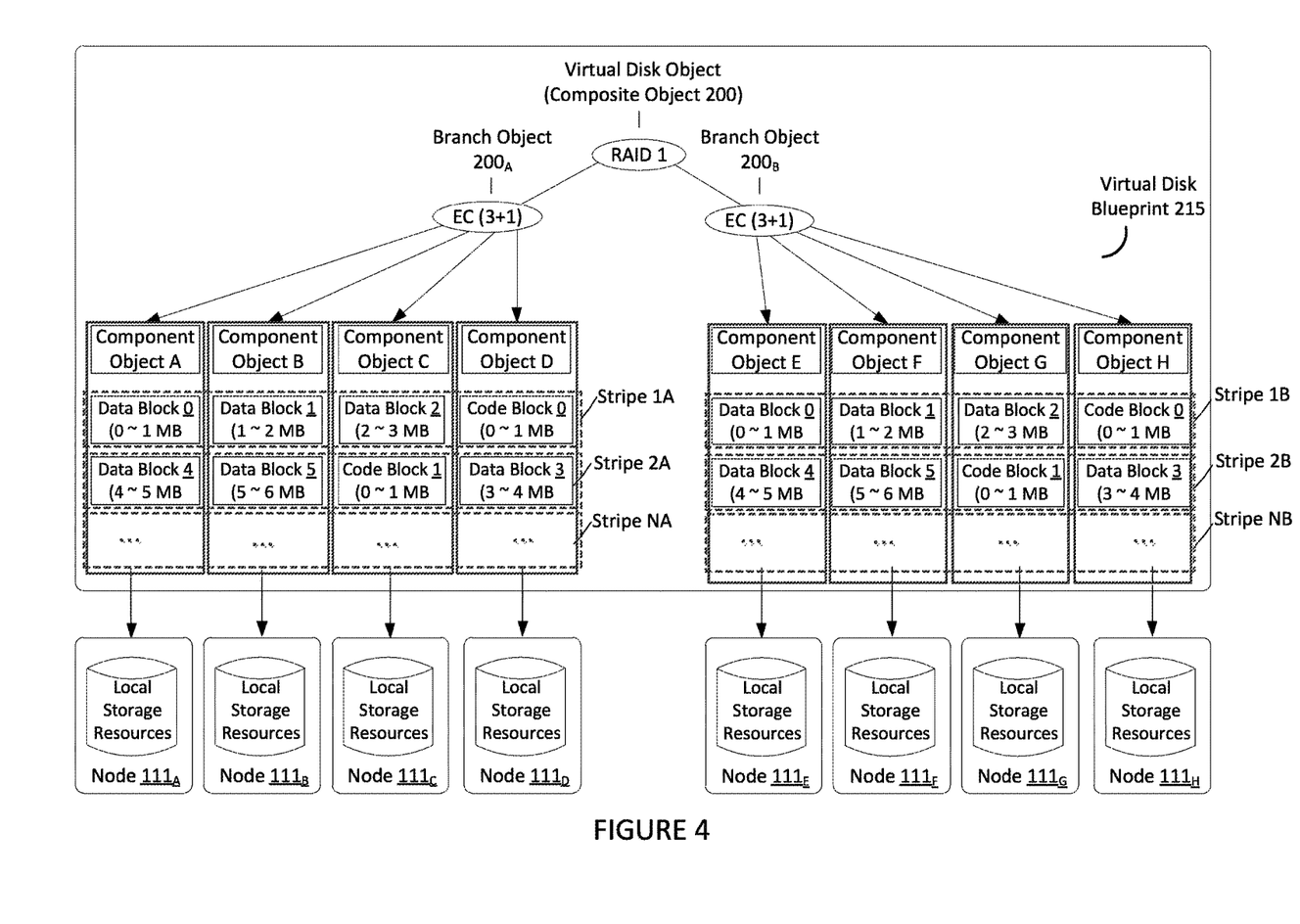
FIG. 4 illustrates an example of applying erasure coding to a virtual disk object, according to some embodiments.

For example, as further described in relation to FIG. 4, depending on the desired level of fault tolerance or performance efficiency, a virtual disk blueprint 215 may direct that composite object 200 be stored in a data store, such as object store 116, in a variety of ways. As an example, FIG. 2 shows composite object 200 that includes a virtual disk blueprint 215 describing a RAID 1 configuration where two mirrored copies of the virtual disk (e.g., mirrors) are each further striped in a RAID 0 configuration. Composite object 200 may thus contain references to a number of "leaf" or "component" objects $220_x$ corresponding to each stripe (e.g., data partition of the virtual disk) in each of the virtual disk mirrors. The metadata accessible by VSAN module 114 in the in-memory metadata database for each component object 220 (e.g., for each stripe) provides a mapping to or otherwise identifies a particular node $111_x$ in cluster 110 that houses the physical storage resources (e.g., magnetic disks 118, etc.) that actually store the stripe (as well as the location of the stripe within such physical resource).

Figure 3:
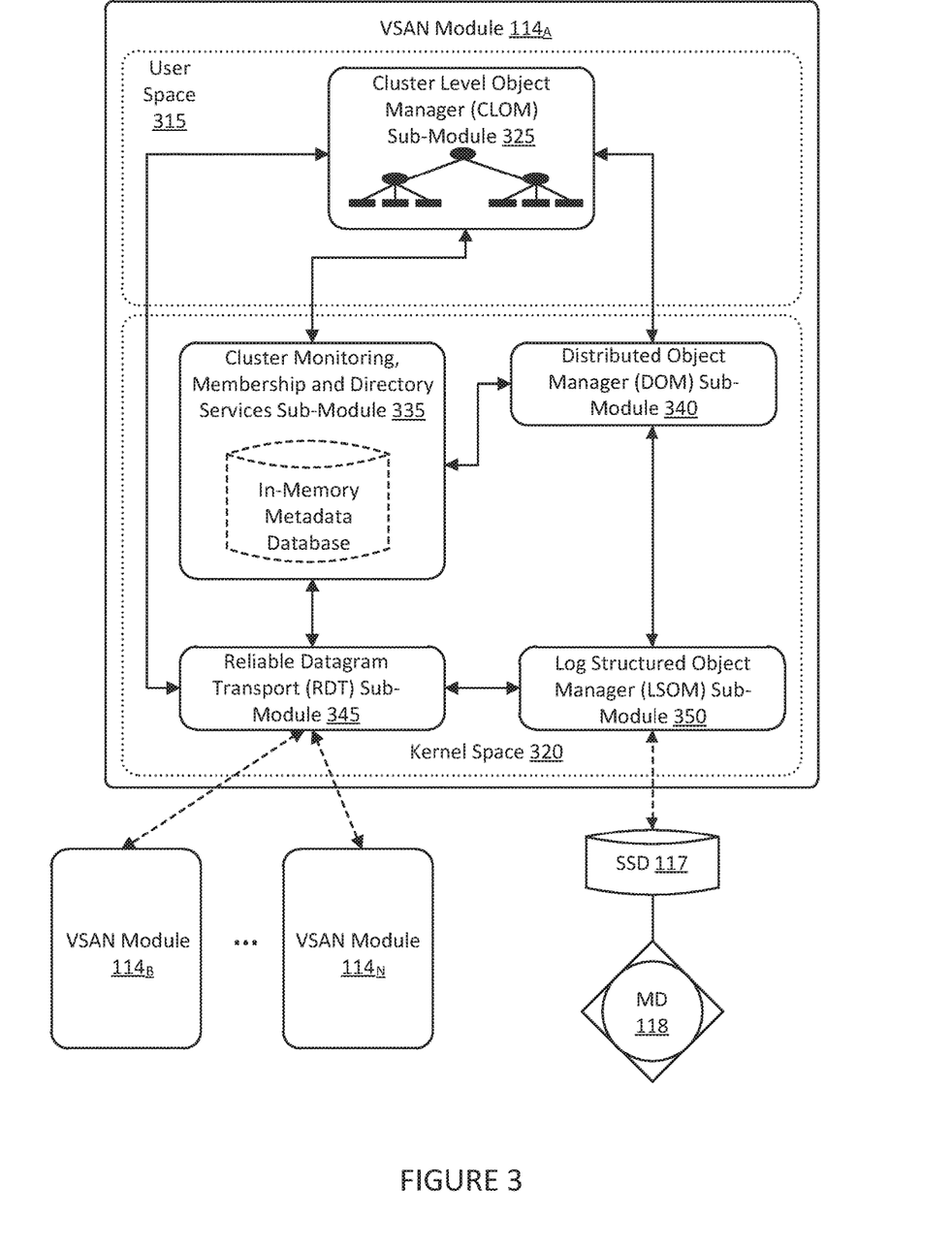
FIG. 3 illustrates components of a VSAN module, according to one embodiment.

FIG. 3 illustrates components of a VSAN module 114, according to one embodiment. As previously described, in certain embodiments, VSAN module 114 may execute as a device driver exposing an abstraction of a VSAN 115 to hypervisor 113. Various sub-modules of VSAN module 114 handle different responsibilities and may operate within either user space 315 or kernel space 320 depending on such responsibilities. As depicted in the embodiment of FIG. 3, VSAN module 114 includes a cluster level object management (CLOM) sub-module 325 that operates in user space 315. CLOM sub-module 325 generates virtual disk blueprints during creation of a virtual disk by an administrator and ensures that objects created for such virtual disk blueprints are configured to meet storage profile or policy requirements set by the administrator. In addition to being accessed during object creation (e.g., for virtual disks), CLOM sub-module 325 may also be accessed (e.g., to dynamically revise or otherwise update a virtual disk blueprint or the mappings of the virtual disk blueprint to actual physical storage in object store 116) on a change made by an administrator to the storage profile or policy relating to an object or when changes to the cluster or workload result in an object being out of compliance with a current storage profile or policy.

In one embodiment, if an administrator creates a storage profile or policy for a composite object such as virtual disk object 200, CLOM sub-module 325 applies a variety of heuristics and/or distributed algorithms to generate virtual disk blueprint 215 that describes a configuration in cluster 110 that meets or otherwise suits the storage policy (e.g., RAID configuration to achieve desired redundancy through mirroring and access performance through striping, which nodes' local storage should store certain portions/partitions/stripes of the virtual disk to achieve load balancing, etc.). For example, CLOM sub-module 325, in one embodiment, is responsible for generating blueprint 215 describing the RAID 1/RAID 0 configuration for virtual disk object 200 in FIG. 2 when the virtual disk was first created by the administrator. As previously discussed, a storage policy may specify requirements for capacity, IOPS, availability, and reliability. Storage policies may also specify a workload characterization (e.g., random or sequential access, I/O request size, cache size, expected cache hit ratio, etc.). Additionally, the administrator may also specify an affinity to VSAN module 114 to preferentially use certain nodes 111 (or the local disks housed therein). For example, when provisioning a new virtual disk for a VM, an administrator may generate a storage policy or profile for the virtual disk specifying that the virtual disk have a reserve capacity of 400 GB, a reservation of 150 read IOPS, a reservation of 300 write IOPS, and a desired availability of 99.99%. Upon receipt of the generated storage policy, CLOM sub-module 325 consults the in-memory metadata database maintained by its VSAN module 114 to determine the current state of cluster 110 in order to generate a virtual disk blueprint for a composite object (e.g., the virtual disk object) that suits the generated storage policy. As further discussed below, CLOM sub-module 325 may then communicate the blueprint to its corresponding distributed object manager (DOM) sub-module 340 which interacts with object store 116 to implement the blueprint by, for example, allocating or otherwise mapping component objects (e.g., stripes) of the composite object to physical storage locations within various nodes 111 of cluster 110.

In addition to CLOM sub-module 325 and DOM sub-module 340, as further depicted in FIG. 3, VSAN module 114 may also include a cluster monitoring, membership, and directory services (CMMDS) sub-module 335 that maintains the previously discussed in-memory metadata database to provide information on the state of cluster 110 to other sub-modules of VSAN module 114 and also tracks the general "health" of cluster 110 by monitoring the status, accessibility, and visibility of each node 111 in cluster 110. The in-memory metadata database serves as a directory service that maintains a physical inventory of the VSAN environment, such as the various nodes 111, the storage resources in the nodes 111 (SSD, magnetic disks, etc.) housed therein and the characteristics/capabilities thereof, the current state of the nodes 111 and there corresponding storage resources, network paths among the nodes 111, and the like. As previously discussed, in addition to maintaining a physical inventory, the in-memory metadata database further provides a catalog of metadata for objects stored in object store 116 (e.g., what composite and component objects exist, what component objects belong to what composite objects, which nodes serve as "coordinators" or "owners" that control access to which objects, quality of service requirements for each object, object configurations, the mapping of objects to physical storage locations, etc.). As previously discussed, other sub-modules within VSAN module 114 may access CMMDS sub-module 335 (represented by the connecting lines in FIG. 3) for updates to learn of changes in cluster topology and object configurations. For example, as previously discussed, during virtual disk creation, CLOM sub-module 325 accesses the in-memory metadata database to generate a virtual disk blueprint, and in order to handle an I/O operation from a running VM 112, DOM sub-module 340 accesses the in-memory metadata database to determine the nodes 111 that store the component objects (e.g., stripes) of a corresponding composite object (e.g., virtual disk object) and the paths by which those nodes are reachable in order to satisfy the I/O operation.

As previously discussed, DOM sub-module 340, during the handling of I/O operations as well as during object creation, controls access to and handles operations on those component objects in object store 116 that are stored in the local storage of the particular node 111 in which DOM sub-module 340 runs as well as certain other composite objects for which its node 111 has been currently designated as the "coordinator" or "owner." For example, when handling an I/O operation from a VM, due to the hierarchical nature of composite objects in certain embodiments, a DOM sub-module 340 that serves as the coordinator for the target composite object (e.g., the virtual disk object that is subject to the I/O operation) may need to further communicate across the network with a different DOM sub-module 340 in a second node 111 (or nodes) that serves as the coordinator for the particular component object (e.g., stripe, etc.) of the virtual disk object that is stored in the local storage of the second node 111 and which is the portion of the virtual disk that is subject to the I/O operation. If the VM issuing the I/O operation resides on a node 111 that is also different from the coordinator of the virtual disk object, the DOM sub-module 340 of the node running the VM would also have to communicate across the network with the DOM sub-module 340 of the coordinator. In certain embodiments, if the VM issuing the I/O operation resides on a node that is different from the coordinator of the virtual disk object subject to the I/O operation, the two DOM sub-modules 340 of the two nodes may communicate to change the role of the coordinator of the virtual disk object to the node running the VM (e.g., thereby reducing the amount of network communication needed to coordinate I/O operations between the node running the VM and the node serving as the coordinator for the virtual disk object).

DOM sub-modules 340 also similarly communicate amongst one another during object creation. For example, a virtual disk blueprint generated by CLOM module 325 during creation of a virtual disk may include information that designates which nodes 111 should serve as the coordinators for the virtual disk object as well as its corresponding component objects (stripes, etc.). Each of the DOM sub-modules 340 for such designated nodes is issued requests (e.g., by the DOM sub-module 340 designated as the coordinator for the virtual disk object or by the DOM sub-module 340 of the node generating the virtual disk blueprint, etc. depending on embodiments) to create their respective objects, allocate local storage to such objects (if needed), and advertise their objects to their corresponding CMMDS sub-module 335 in order to update the in-memory metadata database with metadata regarding the object. In order to perform such requests, DOM sub-module 340 interacts with a log structured object manager (LSOM) sub-module 350 that serves as the component in VSAN module 114 that actually drives communication with the local SSDs and magnetic disks of its node 111. In addition to allocating local storage for component objects (as well as to store other metadata such a policies and configurations for composite objects for which its node serves as coordinator, etc.), LSOM sub-module 350 additionally monitors the flow of I/O operations to the local storage of its node 111, for example, to report whether a storage resource is congested.

FIG. 3 also depicts a reliable datagram transport (RDT) sub-module 345 that delivers datagrams of arbitrary size between logical endpoints (e.g., nodes, objects, etc.), where the endpoints may potentially be over multiple paths. In one embodiment, the underlying transport is transmission control protocol (TCP). Alternatively, other transports such as remote direct memory access (RDMA) may be used. RDT sub-module 345 is used, for example, when DOM sub-modules 340 communicate with one another, as previously discussed above to create objects or to handle I/O operations. In certain embodiments, RDT module 345 interacts with CMMDS module 335 to resolve the address of logical endpoints dynamically in order to maintain up-to-date location information in the in-memory metadata database as well as to create, remove, or reestablish connections based on link health status. For example, if CMMDS module 335 reports a link as unhealthy, RDT sub-module 345 may drop the connection in favor of a link in better condition.

As described above, in some cases, one or more nodes 111 within node cluster 110 may fail or go offline. For example, in some cases, local storage resources of a node 111 may fail resulting in a loss of the data blocks stored by the node. In such cases, the distributed storage system or VSAN environment 100 has to be able to tolerate such a failure and efficiently reconstruct the missing data blocks. In some other cases, a node 111 may go offline temporarily and then come back online resulting in some out-of-synch data blocks. Similarly, in such cases, the distributed storage system has to be configured with fault tolerance technologies to resynch such out-of-synch data blocks. Accordingly, to increase performance efficiency and fault tolerance, distributed storage systems (e.g. VSAN environment 100) may implement a variety of fault tolerance technologies, such as the various levels of Redundant Array of Independent Disks (RAID) and/or erasure coding, etc. As described above in relation to FIG. 2, depending on the required level of performance and fault tolerance, virtual disk blueprint 215 may direct that composite object 200 be distributed and stored across the object store 116 in one of several ways. In some embodiments, one or a combination of RAID levels (e.g. RAID 0 to RAID 6) is used, where each RAID level or a combination thereof provides a different level of fault tolerance and performance enhancement. Referring back to FIG. 2, for example, FIG. 2 illustrates an example of the application of RAID 1, which entails creating a replica of composite object 200. This is to ensure that a second copy of composite object 200 is still available if a first copy is lost due to some sort of failure (e.g. disk failure etc.).

In addition to RAID 1, FIG. 2 also illustrates the application of RAID 0 to the two copies of composite object 200 (branch object 200A and branch object 200B, created as a result of RAID 1). Under RAID 0, composite object 200 is partitioned into smaller data stripes and distributed across local storage resources of various nodes in the object store 116. In some cases, striping composite object 200 over local storage resources of various nodes enhances performance as compared to storing the entire copy of composite object 200 in a single node. This is because striping the data means that smaller amounts of data are written to or read from local storage resources of multiple nodes in parallel, thereby reducing the amount of time to complete a particular read or write operation. However, multiplying the number of nodes used to store the various stripes of data increases the probability of failure, therefore, causing data loss.

Accordingly, to achieve a higher level of fault tolerance, in some embodiments, erasure coding is applied. Erasure coding is a method of data protection in which composite object 200, for example, is further partitioned into stripes, expanded and encoded with redundant data pieces, and stored across the object store 116. As an example, in some embodiments, a copy of composite object 200 is organized or partitioned into stripes, each of which is broken up into N equal-sized data blocks. Without applying EC, in some embodiments, the N data blocks are distributed to different nodes for storage across the object store 116, such that the original stripe is reconstructable by putting the N data blocks together. However, in some cases, one or more nodes, hosting each one of N data blocks of composite object 200, may fail or go offline. In such cases, data loss may result and there may be no way of recovering such data block absent any fault tolerance mechanisms.

Accordingly, in some embodiments, to address such situations and provide fault tolerance, erasure codes are used to encode an additional M equal-sized code block(s) (interchangeably referred to as "parity blocks") from the original N data blocks, where N is a larger number than M. Depending on the level of fault tolerance desired, different erasure codes are applied in creating the one or more M code blocks. RAID 5 and RAID 6 are common examples of applying erasure coding. RAID 5, for example, may apply an Exclusive OR (i.e. XOR) function to compute a single code block using the existing data blocks in a data stripe. RAID 5, therefore, requires at least 3 nodes or 3 disk drives to host two data blocks on two nodes and the code block on the third node. An example of the application of RAID 5 in a distributed storage system is illustrated in FIG. 4.

As updates are made to the original N data blocks, the one or more M code blocks are updated as well. For example, if an updated data block is written to one of the N data blocks, one or more of the M code blocks may be recalculated by applying an XOR function again to the N data blocks including the updated data block. Alternatively, a code block may be recalculated by applying a function to the existing code block, the updated data block, and the original version of the data block that was updated, such that the other data blocks are not accessed directly. Methods of choosing between these techniques will be discussed in more detail below with respect to FIG. 5.

FIG. 4 shows each copy of composite object 200 being erasure coded with a 3+1 ratio, such that each copy is partitioned into multiple stripes (e.g. stripes 1A-NA, stripes 1B-NB), where each stripe is further broken up into 3 data blocks (N) and 1 code block (M) (e.g. 3+1 ratio). It is important to note that the (3+1) EC ratio is merely an example and is not intended to limit the scope of the present disclosure. For example, under RAID 5, a larger number of data blocks, such as 5 or 6 or 10 data blocks, may be used to generate a single code block, resulting in EC ratios of (5+1), (6+1), or (10+1), etc., respectively.

In the example of FIG. 4, using the (3+1) EC ratio, each data or code block includes 1 MB of data such that each data stripe comprises 4 MBs of data. In other embodiments, the data or code blocks may have other sizes, ranging from 0.1 MB to 10 GB. As further illustrated in FIG. 4, the data and code blocks in each stripe are distributed to local storage resources of a variety of nodes (e.g. Node A through Node H). For example, component object A comprises all data or code blocks of branch object 200a that are stored in Node $111_A$, while component object B includes all data or code blocks of branch object 200a that are stored in Node $111_B$. In some embodiments, each component object is 1 GB in size.

Under RAID 5, code blocks of each stripe of data are distributed across various nodes, such that, for instance, code block 0 of stripe 1A is stored in Node $111_D$ while code block 1 of stripe 2A is stored in Node $111_C$. This is because, if all the code blocks were stored in one node, such as Node $111_D$, all the code blocks may be lost in the event that Node $111_D$ fails and, therefore, the corresponding data blocks may no longer be reconstructable in case of multiple node failures. Also, storing all the code blocks in one node may create a bottleneck because Node $111_D$ is the only node that would be repeatedly accessed to use the code blocks. Under RAID 5, in the event that a data block is lost or needs to be resynched due to a node failing or going offline, the data blocks may be reconstructed or resynched by performing an XOR of the related blocks in a corresponding stripe on the remaining operational disk drives or nodes. Accordingly, under RAID 5, any N number of blocks, including a code block, are sufficient to reconstruct or resynch a data block.

Because the code blocks are calculated based on the data blocks (e.g., using an XOR function), an updated data block may result in the recalculation of a code block which is based on the data block. For example, if data block 0 is updated, code block 0 may be recalculated by a first method of applying a function (e.g., XOR) to the updated data block 0, data block 1, and data block 2. Alternatively, code block 0 may be recalculated by a second method of applying a function (e.g., XOR) to the existing code block 0 and a difference between the old value and the updated value of data block 0. If all Nodes 111 are accessible (e.g., there are no read failures or connectivity issues), and all data blocks and code blocks can be read, the first method is preferable when M−1<=N+1. This is because M−1 read operations are performed in the first method, while N+1 read operations are performed in the second method. Consider the example shown, where M=3 and N=1, meaning that each stripe contains 3 data blocks and 1 code block. Recalculating the code block based on an updated data block and all of the other data blocks requires reading all of the other data blocks (in this case, M−1=3−1=2 read operations are required). Recalculating the code block based on the existing code block and a difference of the updated data block 0 and the old value of data block 0 requires reading the N code blocks (in this case 1) and the old value of the data block (which is also 1 read operation, and so N+1=1+1=2 read operations are required). Because the two methods use an equal number of read operations, the first method is chosen.

The M−1<=N+1 rule for determining the best method for recalculating a code block does not work in all cases, however. For example, when one or more Nodes 111 are inaccessible, or when one or more blocks cannot be otherwise read, additional read operations may be needed in order to reconstruct the one or more blocks. In these cases, it is beneficial to determine the total number of read operations required to perform each of the two methods, and select the method with the smallest number of read operations. This process will be discussed in more detail below with respect to FIG. 5.

In some other embodiments (not shown), RAID 6 may be used to protect against failure of two nodes or disk drives. Under RAID 6, instead of using XOR functions, the Reed-Solomon (RS) algorithm, which is another form of EC, is used to generate two code blocks and, therefore, guard against multiple node failures per stripe of data. As a result, under RAID 6, at least 4 disk drives or nodes are required, such that each stripe of data may comprise at least 2 data blocks and 2 code blocks. Under RAID 6, while the number of code blocks is always 2, the number of data blocks used to generate those 2 code blocks may vary. For example, there may be 8 data blocks, from which 2 code blocks may be produced under RAID 6. Similar to RAID 5, under RAID 6, the code blocks may also be distributed across nodes to reduce the likelihood of using all code blocks all at once.

As described above, RAID 5 and RAID 6 are merely used as common examples of erasure coding and are not intended to limit the scope of the present disclosure. For example, other EC functions or operations may be used to produce code blocks from a set of data blocks. In addition, different EC methods may result in different number of data blocks and code blocks in each stripe of data. For example, in some embodiments, composite object 200 may be erasure coded such that each stripe of data may comprise 10 data blocks and 4 code blocks. In such embodiments, similar to RAID 5 and RAID 6, any 10 data blocks (or N in general, as described above) may be sufficient to reproduce any compromised data block.

As described above, prior to applying erasure coding (e.g. RAID 5), FIG. 4 shows composite object 200 being mirrored or duplicated into two copies by applying RAID 1. In some embodiments, other mirroring methodologies are used, such that composite object 200 is mirrored into more than two copies (e.g. 3, 4, 5, etc. copies). In some embodiments, this mirroring allows an additional level of fault tolerance such that in the event that a set of nodes that have the same fault domain fails (e.g., rack), data may be fetched from the mirror copies of composite object 200.

As an example, Node 111B may disconnect from the distributed storage system for some time. As described above, data block 0 may be updated, and code block 0 may need to be recalculated as a result. Because Node 111B is not accessible, data block 1 cannot be read from component object B in order to calculate code block 0 based on all of the data blocks. However, data block 1 is also available at component object F, the mirror copy which is stored on Node 111F. A such, data block 1 can be read from component object F without requiring additional read operations to reconstruct data block 1 from other blocks. In some embodiments, the search for identical copies of a certain data block is performed by VSAN module 114 using the logical address space of composite object 200. More specifically, each composite object 200 stored in object store 116 has a logical address space for all data blocks, stored in the metadata of composite object 200. Every data block is then mapped into the logical address space of composite object 200. That is, as shown in FIG. 4, composite object 200 comprises a number of data component objects (e.g. component object A, B, etc.), each of which further includes a number of data blocks. Each data block has a length and an offset, which indicates the distance or displacement between the starting logical address of a corresponding component object and the data block. The logical block address of a data block, in some embodiments, is then calculated or derived by traversing from the root node of the object layout tree (e.g. virtual blueprint 215) of a composite object 200, stored in the in-memory metadata database, to derive the offset of the data block, which corresponds to its logical block address.

It is important to note that, when a composite object 200 is mirrored, such as in FIG. 4, each copy of data block in a composite object 200 still has the same logical block address in the address space. That is, data block 1 of component object B of branch object 200a has the same logical block address as data block 1 of component object F of branch object 200b. Accordingly, in some embodiments, once the logical block address of data block 1 of component object B is derived, VSAN module 114 then searches the address space of composite object 200 to find another data block with the same logical block address and length, which is data block 1 of component object F.

While VSAN module 114 maintains an address space for all the data blocks within a composite object 200, an address space for the code blocks may be maintained separately from the address space of the data blocks (e.g., by an entity other than VSAN module 114), and is not addressed in the present disclosure.

Although the embodiments above were described in relation to FIG. 4, which illustrates mirroring composite object 200 into two copies, in some embodiments, the embodiments also apply to cases where composite object 200 is mirrored into more than two copies. This is because each code or data block has the same logical block address as its mirrored copies, regardless of how many mirrored copies are created. In addition, the embodiments described above similarly apply in cases where an application of an erasure coding algorithm results in more than one code block in each data stripe of composite object 200. An example of this, as described above, is RAID 6, where there are two code blocks for each set of data blocks in a data stripe. In addition, other erasure coding algorithms may also be applied resulting in more than 2 code blocks for a set of data blocks. For example, in some embodiments, there may be 10 data blocks and 4 code blocks.

However, as long as each mirror copy of composite object 200 maintains the same ratio as the other mirror copies, the embodiments above are similarly applicable. For example, in some embodiments, each mirror copy of composite object 200 is partitioned into stripes having 9 data blocks and 3 code blocks. In such embodiments, each data or code block still maintains the same logical block address from one mirror copy to another. In another example, one mirror copy may be partitioned with a 3+1 ratio (i.e. 3 data blocks and 1 code block in each stripe) while another mirror copy may be partitioned with a 6+2 ratio (i.e. 6 data blocks and 2 code blocks). In some such embodiments, assuming that the same algorithm (e.g., XOR) is used to calculate each code block, the logical block address and length of a data or code block can be used to search for mirrored data or code block with the same logical block address and length. However, in some embodiments, the algorithms used for different code blocks may be different.

Figure 5:
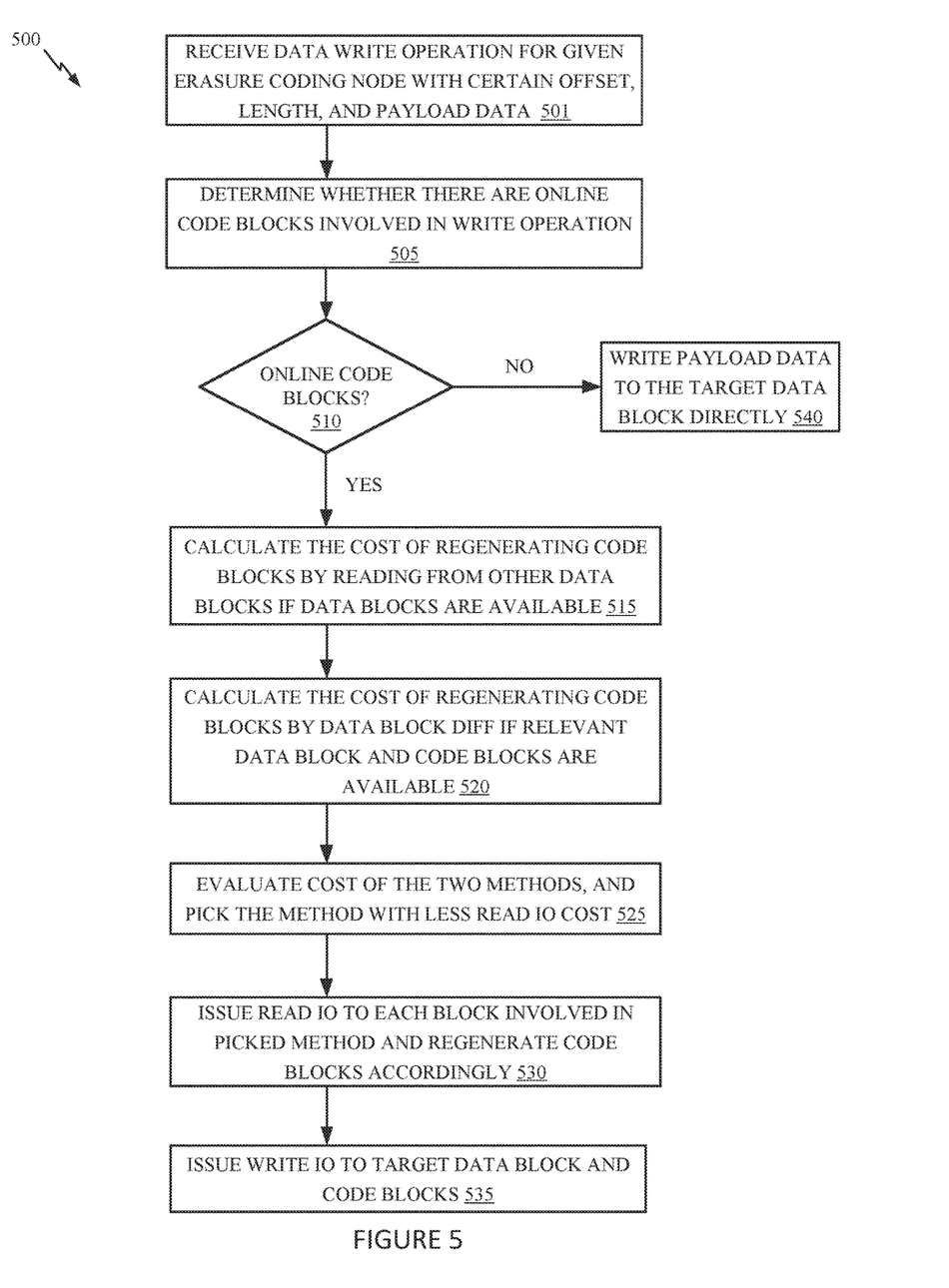
FIG. 5 illustrates example operations for recalculating a code block of an erasure coded virtual disk object in response to an updated data block, according to some embodiments.

FIG. 5 illustrates example operations 500 for regenerating a code block of an erasure coded virtual disk object in response to an updated data block, according to some embodiments. Operations 500 may be implemented, for example, by the coordinator of the virtual disk object, and may ensure that the most efficient method for regenerating the code block is used. For example, an update may be made to data block 0, and code block 0 may need to be regenerated as a result. As discussed above, there are two different methods by which a code block may be regenerated, and operations 500 are directed towards determining which method is more efficient under given circumstances.

At 501, the coordinator receives a data write operation to be written at a given erasure coding node, the data update including a certain length and offset, as well as payload data. The write operation may, for example, be the result of a file modification, and the payload data may comprise an update to a data block (e.g., data block 0).

At 505, the coordinator determines whether the write operation involves any online code blocks. For example, an update to a data block may require regenerating one or more corresponding code blocks based on the update. The coordinator may determine whether code blocks are involved based, for example, on object metadata which associates code blocks with data blocks. A code block is considered to be online if it is accessible on the network (e.g., if a Node 111 on which the code block is stored is online).

At 510, the coordinator makes a decision based on the determination of whether online code blocks are involved in the write operation. If one or more online code blocks are not involved (e.g., there are no code blocks based on the target data block or all relevant code blocks are offline), operations continue at 540, where the payload data (e.g., the data update) is written to the target data block directly without regenerating any code blocks. If one or more online code blocks are involved, operations continue to 515 in order to determine the most efficient method of regenerating the one or more code blocks.

At 515, the coordinator calculates the cost of regenerating the one or more code blocks by the first method of reading from the other data blocks if all of the other data blocks are available (e.g., accessible at online nodes or reconstructable from other blocks). Cost determinations may be made by the coordinator based on the object layout tree (e.g. virtual blueprint 215) of the composite object 200, stored in the in-memory metadata database. The first method involves applying a function (e.g., an XOR) to the updated value of the data block (e.g., the payload data of the write operation, which is an updated value of data block 0) and the other data blocks (e.g., data block 1 and data block 2). Because the updated value of the data block (e.g., data block 0) has been received as payload data, only the other data blocks (e.g., data block 1 and data block 2) need to be read from nodes in order to perform this method.

Calculating the cost of the method involves determining the number of read operations required to perform the method. If all of the other data blocks can be read directly (e.g., if data block 1 and data block 2 can be read from Node 111B and Node 111C or from the mirror copies on Node 111F and 111G), then the number of read operations is equal to the number of other nodes (e.g., two). If some of the other data blocks cannot be read due, for example, to a node failure, then additional read operations are necessary in order to reconstruct the data blocks which cannot be read. For example, if Node 111B and Node 111F are both offline, then data block 1 cannot be read. As discussed above, however, a data block can be reconstructed using any N blocks. In this case, data block 1 can be reconstructed based on data block 0, data block 2, and code block 0. This would require three read operations, and so the cost of the reconstruction would be three read operations.

At 520, the coordinator calculates the cost of regenerating the one or more code blocks by the second method of using the data block diff if the data block and the one or more code blocks are available (e.g., accessible at online nodes or reconstructable from other blocks). The second method involves applying a function (e.g., an XOR) to the existing values of the one or more code blocks (e.g., code block 0) and a diff between the updated value of the data block (e.g., the payload data of the write operation, which is an updated value of data block 0) and the old value of the data blocks (e.g., the currently stored value of data block 0). The updated value of the data block has been received as payload data, so a read operation is not necessary for this value. If the one or more code blocks and the data block can be read directly (e.g., if code block 0 and data block 0 can be read from Node 111A and Node 111D or from the mirror copies on Node 111E and Node 111H), then the cost is the number of code blocks plus the one read operation for the data block (in this case, there is one code block, so the cost would be 2 read operations).

If one of the blocks cannot be read due, for example, to a node failure, then additional read operations are necessary in order to reconstruct the blocks which cannot be read. For example, if Node 111A and Node 111E are offline, then data block 0 may be reconstructed based on data block 1, data block 2, and code block 0. This would require three read operations, and so the cost of the reconstruction would be three read operations.

At 525, the coordinator evaluates the cost of the two methods and picks the method with less read I/O cost. If the two methods have the same read I/O cost, the coordinator selects the first method, as it does not require a diff operation to be performed. For example, if all blocks are available, the cost of the first method may be two (e.g., reading data block 1 and data block 2) and the cost of the second method may also be two (e.g., reading data block 0 and code block 0). In this case, the first method is picked.

At 530, the coordinator issues read I/O to each block involved in the method picked 525, and regenerates code blocks accordingly. For example, if the first method is picked, the coordinator reads the other data blocks (e.g., data block 1 and data block 2), and then applies the function (e.g., XOR) to these blocks and the updated value of the data block received as payload data in order to regenerate the one or more code blocks (e.g., code block 0). In the case that the second method is picked, coordinator reads the existing value of the data block (e.g., data block 0) and the one or more code blocks (e.g., code block 0), and then applies the function (e.g., XOR) to the one or more code blocks and a diff between the existing value of the data block and the update value of the data block received as payload data in order to regenerate the one or more code blocks (e.g., code block 0).

At 535, the coordinator issues write I/O to the target data block and the one or more code blocks. For example, the coordinator writes the payload data (the updated value of data block 0) to data block 0 at Node 111A and the mirror copy at Node 111E. The coordinator also writes the regenerated value of the one or more code blocks to the one or more code blocks. For example, the coordinator may write the regenerated code block 0 calculated at 530 to code block 0 at Node 111D and the mirror copy at Node 111H.

While the choice between the two methods may appear straightforward, it becomes more complex as the number of data blocks, code blocks, and mirror copies grows. As such, operations 500 allow for the most efficient method of regenerating code blocks to be selected in scalable systems. In some embodiments, if the coordinator determines that calculating the read I/O costs of the two methods will use more than a threshold amount of processing resources, a general rule may be applied instead of making the calculation. For example, if calculating the costs of the two methods exceeds a certain amount of time (e.g., based on a stored threshold value), a general rule may be applied which specifies that the first method is selected when $M-1<=N+1$.

In alternative embodiments, the determination of the cost of the two methods may include additional factors other than read I/O cost. For example, the topological proximity of nodes (e.g., based on the object layout tree) may be taken into consideration, such that reading from a closer node will have a lower cost than reading from a more distant node. Other factors, such as network latency and performance metrics of the various nodes, may also be included in the cost determination. In any case, if one of the two methods cannot be performed (e.g., due to node failures which prevent relevant blocks from being read or reconstructed), the other method will be selected.

Certain embodiments as described above involve a hardware abstraction layer on top of a host computer. The hardware abstraction layer allows multiple contexts or virtual computing instances to share the hardware resource. In one embodiment, these virtual computing instances are isolated from each other, each having at least a user application running therein. The hardware abstraction layer thus provides benefits of resource isolation and allocation among the virtual computing instances. In the foregoing embodiments, virtual machines are used as an example for the virtual computing instances and hypervisors as an example for the hardware abstraction layer. As described above, each virtual machine includes a guest operating system in which at least one application runs. It should be noted that these embodiments may also apply to other examples of virtual computing instances, such as containers not including a guest operating system, referred to herein as "OS-less containers" (see, e.g., www.docker.com). OS-less containers implement operating system-level virtualization, wherein an abstraction layer is provided on top of the kernel of an operating system on a host computer. The abstraction layer supports multiple OS-less containers each including an application and its dependencies. Each OS-less container runs as an isolated process in user space on the host operating system and shares the kernel with other containers. The OS-less container relies on the kernel's functionality to make use of resource isolation (CPU, memory, block I/O, network, etc.) and separate namespaces and to completely isolate the application's view of the operating environments. By using OS-less containers, resources can be isolated, services restricted, and processes provisioned to have a private view of the operating system with their own process ID space, file system structure, and network interfaces. Multiple containers can share the same kernel, but each container can be constrained to only use a defined amount of resources such as CPU, memory and I/O.

The various embodiments described herein may employ various computer-implemented operations involving data stored in computer systems. For example, these operations may require physical manipulation of physical quantities—usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more embodiments may be useful machine operations. In addition, one or more embodiments also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The various embodiments described herein may be practiced with other computer system configurations including hand-held devices, microprocessor systems, microprocessor-based or programmable consumer electronics, minicomputers, mainframe computers, and the like.

One or more embodiments may be implemented as one or more computer programs or as one or more computer program modules embodied in one or more computer readable media. The term computer readable medium refers to any data storage device that can store data which can thereafter be input to a computer system—computer readable media may be based on any existing or subsequently developed technology for embodying computer programs in a manner that enables them to be read by a computer. Examples of a computer readable medium include a hard drive, network attached storage (NAS), read-only memory, random-access memory (e.g., a flash memory device), a CD (Compact Discs) CD-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

Although one or more embodiments have been described in some detail for clarity of understanding, it will be apparent that certain changes and modifications may be made within the scope of the claims. Accordingly, the described embodiments are to be considered as illustrative and not restrictive, and the scope of the claims is not to be limited to details given herein, but may be modified within the scope and equivalents of the claims. In the claims, elements and/or steps do not imply any particular order of operation, unless explicitly stated in the claims.

Virtualization systems in accordance with the various embodiments may be implemented as hosted embodiments, non-hosted embodiments or as embodiments that tend to blur distinctions between the two, are all envisioned. Furthermore, various virtualization operations may be wholly or partially implemented in hardware. For example, a hardware implementation may employ a look-up table for modification of storage access requests to secure non-disk data.

Many variations, modifications, additions, and improvements are possible, regardless the degree of virtualization. The virtualization software can therefore include components of a host, console, or guest operating system that performs virtualization functions. Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the present application. In general, structures and functionality presented as separate components in exemplary configurations may be implemented as a combined structure or component. Similarly, structures and functionality presented as a single component may be implemented as separate components. These and other variations, modifications, additions, and improvements may fall within the scope of the appended claim(s).

We claim:

1. A method for generating an updated version of an existing code block in response to a data update to an existing data block of a plurality of data blocks in a distributed multi-mirror erasure coding system, comprising:
   determining a first operation cost comprising a number of read operations required to generate the updated version of the existing code block based on the plurality of data blocks and the data update;
   determining a second operation cost comprising a number of read operations required to generate the updated version of the existing code block based on the existing code block, the existing data block, and the data update;
   upon determining that the first operation cost is less than or equal to the second operation cost, generating the updated version of the existing code block based on the plurality of data blocks and the data update;
   upon determining that the second operation cost is less than the first operation cost, generating the updated version of the existing code block based on the one or more code blocks, the existing data block, and the data update.

2. The method of claim 1, wherein the first operation cost and the second operation cost are determined by traversing an object layout tree which comprises a representation of topological locations of the plurality of data blocks and the existing code block.

3. The method of claim 2, wherein the first operation cost and the second operation cost are determined based, at least in part, on an availability of one or more data blocks of the plurality of data blocks.

4. The method of claim 3, wherein the first operation cost and the second operation cost are determined based, at least in part, on the topological locations of the plurality of data blocks and the existing code block in the object layout tree.

5. The method of claim 3, wherein the number of read operations is determined based, at least in part, on the number of read operations required to reconstruct one or more unavailable data blocks.

6. The method of claim 3, wherein an unavailable data block results in a higher operation cost than an available data block.

7. The method of claim 1, wherein the existing code blocks comprises a Reed-Solomon code.

8. A non-transitory computer readable medium comprising instructions to be executed in a computer system, wherein the instructions when executed in the computer system perform a method for generating an updated version of an existing code block in response to a data update to an existing data block of a plurality of data blocks in a distributed multi-mirror erasure coding system, the method comprising:
   determining a first operation cost comprising a number of read operations required to generate the updated version of the existing code block based on the plurality of data blocks and the data update;
   determining a second operation cost comprising a number of read operations required to generate the updated version of the existing code block based on the existing code block, the existing data block, and the data update;
   upon determining that the first operation cost is less than or equal to the second operation cost, generating the updated version of the existing code block based on the plurality of data blocks and the data update;
   upon determining that the second operation cost is less than the first operation cost, generating the updated version of the existing code block based on the one or more code blocks, the existing data block, and the data update.

9. The non-transitory computer readable medium of claim 8, wherein the first operation cost and the second operation cost are determined by traversing an object layout tree which comprises a representation of topological locations of the plurality of data blocks and the existing code block.

10. The non-transitory computer readable medium of claim 9, wherein the first operation cost and the second operation cost are determined based, at least in part, on an availability of one or more data blocks of the plurality of data blocks.

11. The non-transitory computer readable medium of claim 10, wherein the first operation cost and the second operation cost are determined based, at least in part, on the topological locations of the plurality of data blocks and the existing code block in the object layout tree.

12. The non-transitory computer readable medium of claim 10, wherein the number of read operations is determined based, at least in part, on the number of read operations required to reconstruct one or more unavailable data blocks.

13. The non-transitory computer readable medium of claim 10, wherein an unavailable data block results in a higher operation cost than an available data block.

14. The non-transitory computer readable medium of claim 8, wherein the existing code blocks comprises a Reed-Solomon code.

15. A computer system, wherein system software for the computer system is programmed to execute a method for generating an updated version of an existing code block in response to a data update to an existing data block of a plurality of data blocks in a distributed multi-mirror erasure coding system, the method comprising:
   determining a first operation cost comprising a number of read operations required to generate the updated version of the existing code block based on the plurality of data blocks and the data update;
   determining a second operation cost comprising a number of read operations required to generate the updated version of the existing code block based on the existing code block, the existing data block, and the data update;
   upon determining that the first operation cost is less than or equal to the second operation cost, generating the updated version of the existing code block based on the plurality of data blocks and the data update;

upon determining that the second operation cost is less than the first operation cost, generating the updated version of the existing code block based on the one or more code blocks, the existing data block, and the data update.

16. The computer system of claim 15, wherein the first operation cost and the second operation cost are determined by traversing an object layout tree which comprises a representation of topological locations of the plurality of data blocks and the existing code block.

17. The computer system of claim 16, wherein the first operation cost and the second operation cost are determined based, at least in part, on an availability of one or more data blocks of the plurality of data blocks.

18. The computer system of claim 17, wherein the first operation cost and the second operation cost are determined based, at least in part, on the topological locations of the plurality of data blocks and the existing code block in the object layout tree.

19. The computer system medium of claim 17, wherein the number of read operations is determined based, at least in part, on the number of read operations required to reconstruct one or more unavailable data blocks.

20. The computer system of claim 17, wherein an unavailable data block results in a higher operation cost than an available data block.

21. The computer system of claim 15, wherein the existing code blocks comprises a Reed-Solomon code.

* * * * *